United States Patent
Chen (10) Patent No.: US 11,961,472 B2
(45) Date of Patent: Apr. 16, 2024

(54) PIXEL DRIVING CIRCUIT, DISPLAY PANEL INCLUDING A PIXEL DRIVING CIRCUIT, AND ELECTRONIC DEVICE INCLUDING A DISPLAY PANEL

(71) Applicant: VIVO MOBILE COMMUNICATION CO., LTD., Guangdong (CN)

(72) Inventor: Caiqin Chen, Guangdong (CN)

(73) Assignee: Vivo Mobile Communication Co., Ltd., Guangdong (CN)

( * ) Notice: Subject to any disclaimer, the term of this patent is extended or adjusted under 35 U.S.C. 154(b) by 0 days.

(21) Appl. No.: 17/951,198

(22) Filed: Sep. 23, 2022

(65) Prior Publication Data

US 2023/0016926 A1   Jan. 19, 2023

Related U.S. Application Data (63) Continuation of application No. PCT/CN2021/081767, filed on Mar. 19, 2021.

(30) Foreign Application Priority Data

Mar. 24, 2020   (CN) .......................... 202010211246.9

(51) Int. Cl.
*G09G 3/3266* (2016.01)
*G09G 3/3233* (2016.01)
(Continued)

(52) U.S. Cl.
CPC ......... *G09G 3/3233* (2013.01); *G09G 3/3266* (2013.01); *G02F 1/13338* (2013.01);
(Continued)

(58) Field of Classification Search
CPC ...... G09G 3/20; G09G 3/2003; G09G 3/2074; G09G 3/3225; G09G 3/3233;
(Continued)

(56) References Cited

U.S. PATENT DOCUMENTS

| | | | |
|---|---|---|---|
| 2007/0183218 A1* | 8/2007 | Lee | G09G 3/3677 |
| | | | 365/185.26 |
| 2008/0211760 A1* | 9/2008 | Baek | G09G 3/3677 |
| | | | 345/98 |

(Continued)

FOREIGN PATENT DOCUMENTS

| | | |
|---|---|---|
| CN | 105469761 A | 4/2016 |
| CN | 105938711 A | 9/2016 |

(Continued)

*Primary Examiner* — Adam J Snyder
(74) *Attorney, Agent, or Firm* — Price Heneveld LLP (57) ABSTRACT

A pixel driving circuit, a display panel, and an electronic device. The pixel driving circuit includes: a pixel array including a plurality of pixel circuits, an RGBG pixel arrangement mode being adopted in the pixel array; at least four gate lines, arranged in a first direction of the pixel array, one row of pixel circuits being arranged between every two adjacent gate lines, and each row of pixel circuits corresponding to one gate line; at least eight data lines, arranged in a second direction perpendicular to the first direction and intersecting each gate line, each data line being connected to pixel circuits corresponding to sub-pixels of the same color in one column of pixel circuits; and a demultiplexer circuit, connected to the data lines, and configured to control the data lines to be in communication with an integrated circuit chip.

16 Claims, 4 Drawing Sheets

(51) Int. Cl.
*G02F 1/1333* (2006.01)
*G02F 1/1345* (2006.01)
*G02F 1/1362* (2006.01)
*G09G 3/20* (2006.01)
*G09G 3/3225* (2016.01)
*G09G 3/36* (2006.01)
*H10K 59/131* (2023.01)
*H10K 59/35* (2023.01)

(52) U.S. Cl.
CPC .... *G02F 1/13454* (2013.01); *G02F 1/136286* (2013.01); *G09G 3/20* (2013.01); *G09G 3/2003* (2013.01); *G09G 3/2074* (2013.01); *G09G 3/3225* (2013.01); *G09G 3/3648* (2013.01); *G09G 2300/0408* (2013.01); *G09G 2300/0426* (2013.01); *G09G 2300/0452* (2013.01); *G09G 2310/0297* (2013.01); *G09G 2310/08* (2013.01); *G09G 2320/0242* (2013.01); *G09G 2330/021* (2013.01); *H10K 59/131* (2023.02); *H10K 59/35* (2023.02)

(58) Field of Classification Search
CPC ............... G09G 3/3266; G09G 3/3648; G09G 2300/0408; G09G 2300/0426; G09G 2300/0452; G09G 2310/0297; G09G 2310/08; G09G 2320/0242; G09G 2330/021; G02F 1/13338; G02F 1/13454; G02F 1/136286; H01K 59/131; H01K 59/35; H10K 59/131; H10K 59/35
See application file for complete search history.

(56) References Cited

U.S. PATENT DOCUMENTS

| | | |
|---|---|---|
| 2016/0351159 A1 | 12/2016 | Yang et al. |
| 2017/0076665 A1 | 3/2017 | Kim |
| 2017/0140706 A1* | 5/2017 | Song ................... G09G 3/3233 |
| 2018/0047759 A1 | 2/2018 | Zhao et al. |
| 2018/0188578 A1 | 7/2018 | Wang et al. |
| 2018/0204496 A1 | 7/2018 | Zhang et al. |
| 2018/0211579 A1* | 7/2018 | Bae ...................... G09G 3/3607 |
| 2018/0330654 A1* | 11/2018 | Moon ................. G09G 3/3258 |
| 2019/0206966 A1* | 7/2019 | Kim .................... G09G 3/3233 |
| 2019/0228726 A1 | 7/2019 | Ono et al. |
| 2020/0058250 A1 | 2/2020 | Dong et al. |
| 2020/0203460 A1 | 6/2020 | Li et al. |
| 2021/0233455 A1 | 7/2021 | Yang et al. |

FOREIGN PATENT DOCUMENTS

| | | |
|---|---|---|
| CN | 107967886 A | 4/2018 |
| CN | 109285502 A | 1/2019 |
| CN | 110189718 A | 8/2019 |
| CN | 110808005 A | 2/2020 |
| CN | 111383576 A | 7/2020 |
| KR | 20170058492 A | 5/2017 |
| WO | 2017140706 A1 | 8/2017 |
| WO | 2020027443 A1 | 2/2020 |

* cited by examiner

PIXEL DRIVING CIRCUIT, DISPLAY PANEL INCLUDING A PIXEL DRIVING CIRCUIT, AND ELECTRONIC DEVICE INCLUDING A DISPLAY PANEL

CROSS-REFERENCE TO RELATED APPLICATIONS

This application is a continuation application of International Application No. PCT/CN2021/081767 filed on Mar. 19, 2021, which claims the priority of Chinese Patent Application No. 202010211246.9 filed in China on Mar. 24, 2020, which are incorporated herein by reference in their entireties.

TECHNICAL FIELD

The present application relates to the field of display technology, and in particular, to a pixel driving circuit, a display panel and an electronic device.

BACKGROUND

Figure 1:
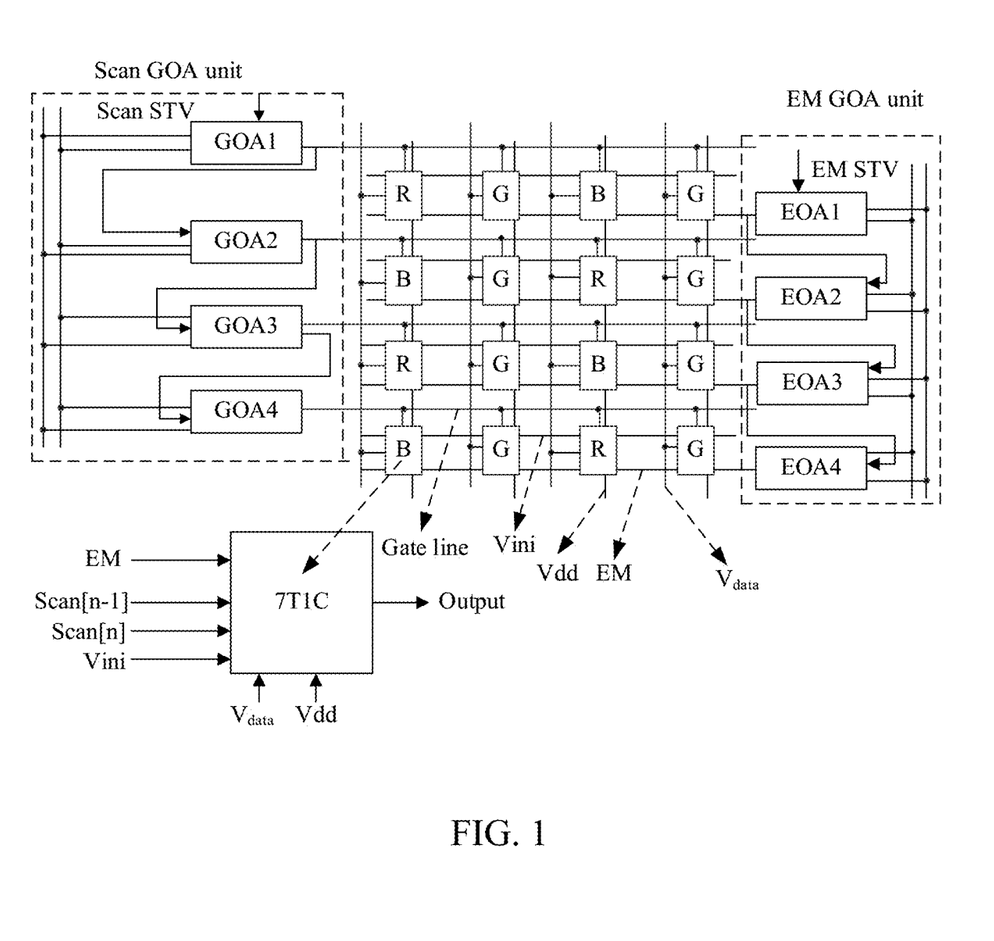
FIG. 1 is a schematic diagram of a driving structure of an AMOLED display panel in the related art.

In a display circuit for an active matrix/organic light-emitting diode (Active Matrix/Organic Light Emitting Diode, AMOLED) panel, each pixel circuit includes a plurality of thin film transistor (Thin Film Transistor, TFT) driving switches and an organic light-emitting diode (Organic Light-Emitting Diode, OLED). A 7T1C (formed by seven TFT transistors and one capacitor) pixel compensation circuit and a driving circuit for driving and lighting each display device unit are usually adopted. Input signals of a 7T1C driving circuit include an OLED light emission control signal (Emission, EM), Scan[n], Scan[n−1], Vini (an initial reset signal), Vdata (a data signal), and Vdd (a high-level signal). The driving circuit usually includes a Scan GOA (Gate Driver On Array, scan gate driver on array circuit) circuit and an EM gate driver on array circuit (Emit Gate Driver On Array, EM GOA). In the Scan GOA circuit and the EM GOA (EOA for short) circuit, input signals such as CK (a clock signal)/XCK (an external clock signal)/VGL (Vgatelow)/VGH (Vgatehigh)/STV (an initial signal) are adopted. After passing through a MOS switch unit of a sequence circuit (formed by a plurality of TFTs and a plurality of capacitors), each row of driving sequence after a stage transmission is outputted to pixel circuits in a display area, as shown in FIG. 1.

In an AMOLED display module, an RGBG pixel arrangement mode is usually adopted (Every two pixels share one green sub-pixel, making an area of blue OLEDs larger, and bringing a higher aperture ratio of the panel. In this way, a current required to reach a considerable luminous intensity is reduced, thereby reducing the attenuation speed and increasing the service life of a display panel.). Compared with a conventional RGB strip arrangement mode, in this arrangement mode, two display colors are provided in one column of pixels. In a stage transmission process, due to a waveform delay caused by R (resistance) and C (capacitance) in the stage transmission process, a scan signal Gate output waveform delay may occur in a Gate (gate line) GOA integrated circuit. In a phase of writing a Vdata voltage of a pixel circuit unit, a Vdata voltage in a previous frame tends to be written, causing a deviation of pure color display. For example, a red picture is bluish, and a blue picture is reddish.

SUMMARY

Embodiments of the present application provide a pixel driving circuit, a display panel and an electronic device, to resolve a problem of a color deviation of pure color display due to an output waveform delay in the related art.

To resolve the foregoing problem, the embodiments of the present application are implemented as follows:

According to a first aspect, the embodiments of the present application provide a pixel driving circuit, comprising:

a pixel array comprising a plurality of pixel circuits, an RGBG pixel arrangement mode being adopted in the pixel array;

at least four gate lines, arranged in a first direction of the pixel array, one row of pixel circuits being arranged between every two adjacent gate lines, and each row of pixel circuits corresponding to one gate line;

at least eight data lines, arranged in a second direction perpendicular to the first direction and intersecting each gate line, each data line being connected to pixel circuits corresponding to sub-pixels of the same color in one column of pixel circuits; and a demultiplexer circuit, connected to the data lines, and configured to control the data lines to be in communication with an integrated circuit (IC) chip.

According to a second aspect, the embodiments of the present application provide a display panel. The display panel comprises the foregoing pixel driving circuit.

According to a third aspect, the embodiments of the present application provide an electronic device, comprising the foregoing display panel.

In the technical solution in the present application, data lines are added to a display area, a demultiplexer circuit is added to a non-display area, and the same data line is adopted for sub-pixels of the same color in a unit column to input data signals. Therefore, when a pure color image is displayed, signals of different colors in a previous frame are prevented from being miswritten, so that a color deviation is avoided, thereby ensuring the consistency of screen display and improving a problem of a color deviation of a display panel.

DETAILED DESCRIPTION

The following clearly and completely describes the technical solutions in the embodiments of the present application with reference to the accompanying drawings in the embodiments of the present application. Apparently, the described embodiments are some of the embodiments of the present application rather than all of the embodiments. All other embodiments obtained by a person of ordinary skill in the art based on the embodiments of the present application without creative efforts shall fall within the protection scope of the present application.

Figure 2:
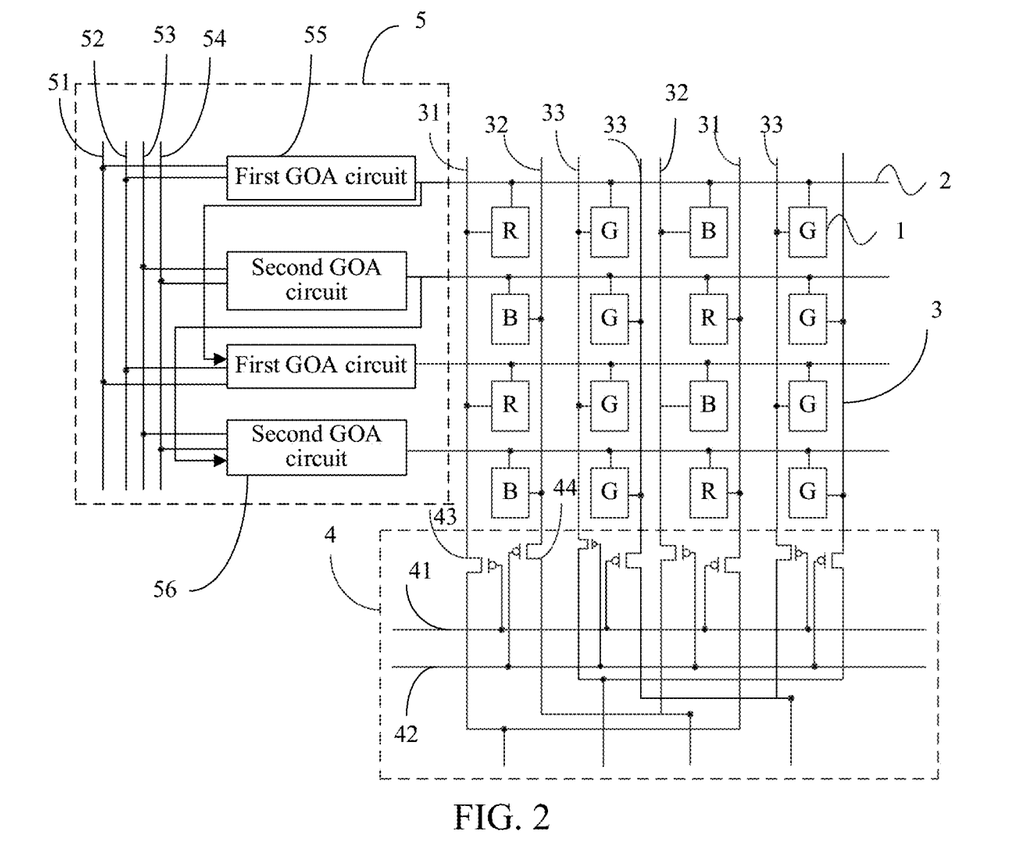
FIG. 2 is a schematic diagram of a pixel driving circuit according to an embodiment of the present application.

Embodiments of the present application provide a pixel driving circuit, as shown in FIG. 2, including:

a pixel array including a plurality of pixel circuits 1, an RGBG pixel arrangement mode being adopted in the pixel array;

at least four gate lines 2, arranged in a first direction of the pixel array, one row of pixel circuits 1 being arranged between every two adjacent gate lines 2, and each row of pixel circuits 1 corresponding to one gate line 2;

at least eight data lines 3, arranged in a second direction perpendicular to the first direction and intersecting each gate line 2, each data line 3 being connected to pixel circuits 1 corresponding to sub-pixels of the same color in one column of pixel circuits 1; and a demultiplexer circuit 4, connected to the data lines 3, and configured to control the data lines 3 to be in communication with an integrated circuit (IC) chip.

Figure 3:
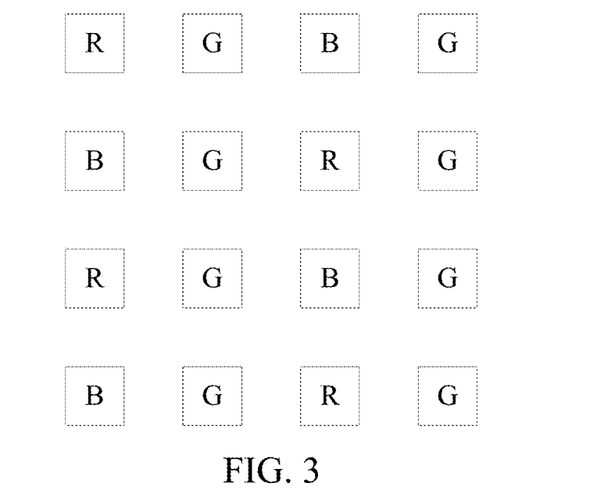
FIG. 3 is a schematic diagram of an RGBG pixel arrangement mode.

The pixel driving circuit provided in the embodiments of the present invention includes a pixel array arranged in a display area, at least four gate lines 2 and at least eight data lines 3 that are arranged in the pixel array, and a demultiplexer circuit 4 arranged in a non-display area. The RGBG pixel arrangement mode is adopted in the pixel array. Reference may be made to FIG. 3 for the RGBG pixel arrangement mode.

The pixel array includes a plurality of pixel circuits 1 arranged in an array. Each pixel circuit 1 and a corresponding organic light-emitting diode form a pixel unit, and a plurality of pixel units form the pixel array.

The at least four gate lines 2 are arranged in the first direction of the pixel array. One row of pixel circuits 1 is arranged between every two adjacent gate lines 2, and each row of pixel circuits 1 corresponds to one gate line 2. The at least eight data lines 3 are arranged in sequence in the second direction and form a cross-arrangement form with each gate line 2. Each data line 3 is connected to pixel circuits 1 corresponding to sub-pixels of the same color in one column of pixel circuits 1, thereby ensuring the consistency of screen display and improving a problem of a color deviation of a display panel.

The data lines 3 are all connected to the demultiplexer circuit 4. The data lines 3 may be in communication with the integrated circuit (IC) chip through the demultiplexer circuit 4, and may further allow the data lines 3 to control a working status of the pixel circuits 1 connected to the data lines.

The pixel driving circuit provided in the embodiments of the present application, data lines are added to a display area, a demultiplexer circuit is added to a non-display area, and the same data line is adopted for sub-pixels of the same color in a unit column to input data signals, thereby ensuring the consistency of screen display and improving a problem of a color deviation of a display panel.

Optionally, in an embodiment of the present application, as shown in FIG. 2, the pixel driving circuit further includes:

a gate driver on array GOA unit 5, connected to an output terminal of the IC chip. The GOA unit 5 includes a first clock signal line 51, a second clock signal line 52, a third clock signal line 53, a fourth clock signal line 54, a plurality of first GOA circuits 55 connected to odd-row gate lines 2, and a plurality of second GOA circuits 56 connected to even-row gate lines 2.

The first GOA circuits 55 are connected to the first clock signal line 51 and the second clock signal line 52, and the second GOA circuits 56 are connected to the third clock signal line 53 and the fourth clock signal line 54.

The first clock signal line 51 and the second clock signal line 52 are in opposite sequences, and the third clock signal line 53 and the fourth clock signal line 54 are in opposite sequences.

The GOA unit 5 is connected to the output terminal of the IC chip, and includes four clock signal lines. Two clock signal lines are added on the basis of the original circuit. A plurality of first GOA circuits 55 and a plurality of second GOA circuits 56 are further included. The number of the first GOA circuits 55 is equal to the number of the odd-row gate lines 2 in the pixel array, and the number of the second GOA circuits 56 is equal to the number of the even-row gate lines 2 in the pixel array. That is, each odd-row gate line 2 corresponds to one first GOA circuit 55, and each even-row gate line 2 corresponds to one second GOA circuit 56.

The first clock signal line 51 and the second clock signal line 52 are in opposite sequences. In addition, the first clock signal line 51 and the second clock signal line 52 are connected as input signal lines to the first GOA circuits 55 to input a clock signal to the first GOA circuits 55.

The third clock signal line 53 and the fourth clock signal line 54 are in opposite sequences. In addition, the third clock signal line 53 and the fourth clock signal line 54 are connected as input signal lines to the second GOA circuits 56 to input a clock signal to each of the second GOA circuits 56.

The GOA unit 5 is connected to the output terminal of the IC chip. A specific form of the connection is as follows: the first clock signal line 51 is connected to a first clock port of the output terminal of the IC chip; the second clock signal line 52 is connected to a second clock port of the output terminal of the IC chip; the third clock signal line 53 is connected to a third clock port of the output terminal of the IC chip; the fourth clock signal line 54 is connected to a fourth clock port of the output terminal of the IC chip; and the first GOA circuit 55 corresponding to the odd-row gate lines 2 and the second GOA circuit 56 corresponding to the even-row gate lines 2 are respectively connected to different driving ports of the output terminal of the IC chip. Two clock signal lines are added, so that miswriting of data signals of different colors caused by a time delay can be improved, thereby improving a problem of a color deviation of the panel.

Optionally, in an embodiment of the present application, as shown in FIG. 2, in ascending order of row numbers, adjacent first GOA circuits 55 are connected to each other and form a stage transmission of the odd-row gate lines 2, and adjacent second GOA circuits 56 are connected to each other and form a stage transmission of the even-row gate lines 2.

Except the first GOA circuit 55 in the last stage, an output terminal of the first GOA circuit 55 in each stage is connected to an input terminal of the first GOA circuit 55 in an adjacent next stage; and except the second GOA circuit 56 in the last stage, an output terminal of the second GOA circuit 56 in each stage is connected to an input terminal of the second GOA circuit 56 in an adjacent next stage.

Among the plurality of first GOA circuits 55 connected to the odd-row gate lines 2, in ascending order of row numbers, a connection between the first GOA circuit 55 in a former stage and the first GOA circuit 55 in a latter stage is implemented, to form the stage transmission of the odd-row gate lines 2. Correspondingly, among the plurality of second GOA circuits 56 connected to the even-row gate lines 2, in ascending order of row numbers, a connection between the second GOA circuit 56 in a former stage and the second GOA circuit 56 in a latter stage is implemented, to form the stage transmission of the even-row gate lines 2. For example, the output terminal of the first GOA circuit 55 connected to a first-row gate line 2 is connected to the input terminal of the first GOA circuit 55 connected to a third-row gate line 2. The output terminal of the first GOA circuit 55 connected to the third-row gate line 2 is connected to the input terminal of the first GOA circuit 55 connected to a fifth-row gate line 2. The output terminal of the second GOA circuit 56 connected to a second-row gate line 2 is connected to the input terminal of the second GOA circuit 56 connected to a fourth-row gate line 2. The output terminal of the second GOA circuit 56 connected to the fourth-row gate line 2 is connected to the input terminal of the second GOA circuit 56 connected to a sixth-row gate line 2.

The distinction between an odd-row stage transmission and an even-row stage transmission is implemented, so that the odd-row stage transmission may correspond to the first clock signal line and the second clock signal line, and the even-row stage transmission may correspond to the third clock signal line and the fourth clock signal. Therefore, the miswriting of data signals of different colors caused by a time delay can be improved, thereby improving a problem of a color deviation of the panel.

It should be noted that the pixel array shown in FIG. 2 is a minimum driving unit, and a plurality of minimum driving units may be combined to form a driving circuit corresponding to a display panel. For example, for a case in which a display panel corresponds to 1080 columns and 2400 rows of pixel circuits, 270 minimum driving units are required in a column direction and 600 minimum driving units are required in a row direction.

Figure 4:
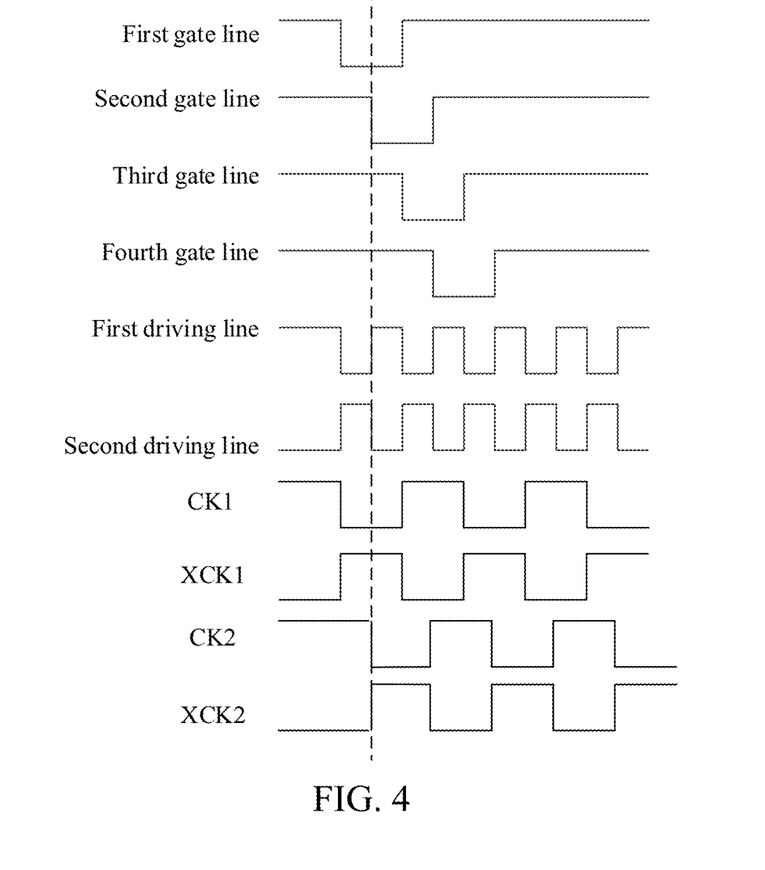
FIG. 4 is a sequence diagram according to an embodiment of the present application.

As shown in FIG. 4, a waveform corresponding to the first clock signal line (CK1) is a waveform generated by superimposing a waveform of a first gate line (the first-row gate line) and an inverse waveform of a third gate line (the third-row gate line). The waveform of a second clock signal line (XCK1) is opposite to that of the first clock signal line. A waveform corresponding to a third clock signal line (CK2) is a waveform generated by superimposing a waveform of a second gate line (the second-row gate line) and an inverse waveform of a fourth gate line (the fourth-row gate line). A waveform of a fourth clock signal line (XCK2) is opposite to that of the third clock signal line, and the third clock signal line (CK2) is delayed by half a pulse compared with the first clock signal line (CK1).

Optionally, in an embodiment of the present application, as shown in FIG. 2 and FIG. 4, for an odd-row gate line 2 and an even-row gate line 2 that are adjacent, compared with a clock signal of a first GOA circuit 55 corresponding to the odd-row gate line 2, a clock signal of the second GOA circuit 56 corresponding to the even-row gate line 2 is delayed by half a pulse.

Two clock signal lines are added to implement the distinction between the odd-row stage transmission and the even-row stage transmission. For an odd-row gate line 2 and an even-row gate line 2 that are adjacent, it is set that a clock signal of a second GOA circuit 56 corresponding to the even-row gate line 2 is delayed by half a pulse compared with a clock signal of a first GOA circuit 55 corresponding to the odd-row gate line 2. The pixel circuits 1 corresponding to the sub-pixels of the same color in each column of pixel circuits 1 can be controlled to work in sequence according to a pulse signal within a continuous time through the cooperation with the data lines 3.

Optionally, in an embodiment of the present application, as shown in FIG. 2, the data lines 3 include first type data lines 31, second type data lines 32, and third type data lines 33.

Each column of pixel circuits 1 is a circuit group, the circuit group corresponding to sub-pixels of the same color is a first circuit group, and the circuit group corresponding to sub-pixels of two colors is a second circuit group.

The first type data line 31 is connected to pixel circuits 1 corresponding to sub-pixels of a first color in the second circuit groups. The second type data line 32 is connected to pixel circuits 1 corresponding to sub-pixels of a second color in the second circuit group. The third type data lines 33 are connected to the pixel circuits 1 in the first circuit group.

The data lines 3 arranged in the second direction correspond to three types. Each type of the data lines 3 may be connected to the corresponding pixel circuits 1 respectively and control the working status of the pixel circuits 1. Each column of pixel circuits 1 may form a circuit group. The circuit group may be determined as one of two different types of circuit groups according to different sub-pixels corresponding to the circuit group. If the pixel circuits 1 in the circuit group correspond to sub-pixels of the same color, the circuit group is a first circuit group. If the pixel circuits 1 in the circuit group correspond to sub-pixels of two colors, the circuit group is a second circuit group.

For the data lines 3, data lines 3 connected to the pixel circuits 1 in the first circuit group are determined as the third type data lines 33, data lines 3 connected to pixel circuits 1 corresponding to sub-pixels of a first color in the second circuit groups are determined as the first type data lines 31, and data lines 3 connected to pixel circuits 1 corresponding to sub-pixels of a second color in the second circuit group are determined as the second type data line 32.

Because the RGBG pixel arrangement mode is adopted in the pixel array, the pixel circuits 1 in the first circuit group correspond to green sub-pixels. The sub-pixels of the first color may be red or blue sub-pixels, and correspondingly the sub-pixels of the second color may be blue or red sub-pixels.

The types of data lines are categorized, so that pixel circuits corresponding to the sub-pixels of different colors can be corresponding data lines, so that the same data line may be adopted for sub-pixels of the same color in a unit column to input data signals, thereby ensuring the consistency of screen display and improving the problem of a color deviation of the display panel.

Optionally, in an embodiment of the present application, as shown in FIG. 2, a sum of the number of the first type data lines 31, the number of the second type data lines 32, and the number of the third type data lines 33 is twice the number of columns corresponding to the pixel circuits 1. One first type data line 31, one second type data line 32, two third type data lines 33, one second type data line 32, one first type data line 31, and two third type data lines 33 are arranged in sequence in the second direction. Each third type data line 33 is connected to a half of the pixel circuits 1 in the first circuit group, and at least two pixel circuits 1 connected to one third type data line 33 are arranged adjacently or at intervals.

Each column of pixel circuits 1 may correspond to two data lines 3. For a circuit group corresponding to sub-pixels of two colors, the two data lines 3 are the first type data line 31 and the second type data line 32 respectively. For a circuit group corresponding to sub-pixels of one color, the two data lines 3 are both the third type data line 33. Therefore, the sum of the number of the first type data lines 31, the number of the second type data lines 32, and the number of the third type data lines 33 is twice the number of the circuit groups. In addition, one first type data line 31, one second type data line 32, two third type data lines 33, one second type data line 32, one first type data line 31, and two third type data lines 33 are arranged in sequence in the second direction.

FIG. 2 is used as an example for description. Data lines D1, D1-1, D2, D2-1, D3, D3-1, D4, and D4-1 are arranged in sequence in the second direction. Pixel circuits 1 corresponding to R (red) sub-pixels in the first column of pixel circuits 1 are driven by D1 (the first type data line). Pixel circuits 1 corresponding to B (blue) sub-pixels in the first column of pixel circuits 1 are driven by D1-1 (the second type data line). Similarly, pixel circuits 1 corresponding to B (blue) sub-pixels in the third column of pixel circuits 1 are driven by D3 (the second type data line). Pixel circuits 1 corresponding to R (red) sub-pixels in the third column of pixel circuits 1 are driven by D3-1 (the first type data line). Pixel circuits 1 corresponding to G (green) sub-pixels in the second column of pixel circuits 1 are also respectively driven by D2 (the third type data line) and D2-1 (the third type data line) by adopting the odd-row and the even-row. The driving manner of the fourth column of pixel circuits 1 is the same as that of the second column. In the second direction, the first type data line 31, the second type data line 32, two third type data lines 33, the second type data line 32, the first type data line 31, and two third type data lines 33 are arranged in sequence.

For the third type data lines 33, each third type data line 33 is connected to a half of the pixel circuits 1 in the first circuit group, and may be connected to the pixel circuits 1 arranged adjacently or at intervals. At least four corresponding pixel circuits 1 are provided in the first circuit group. Therefore, at least two pixel circuits 1 connected to one third type data line (33) are arranged adjacently or at intervals. FIG. 2 shows an example in which one third type data line 33 is connected to two spaced pixel circuits 1.

Optionally, in an embodiment of the present application, as shown in FIG. 2, the demultiplexer circuit 4 includes:

a first driving line 41, a second driving line 42 having a sequence opposite to that of the first driving line 41, at least four first switches 43, and at least four second switches 44.

The first driving line 41 and the second driving line 42 are connected to the output terminal of the IC chip.

The first type data line 31 and one third type data line 33 in each first circuit group correspond to the first switch 43, and the second type data line 32 and another one third type data line 33 in each first circuit group correspond to the second switch 44.

A control terminal of the first switch 43 is connected to the first driving line 41 and is configured to allow communication between the first type data line 31 and a corresponding port data line and communication between a half of the third type data lines 33 and a corresponding port data line under the control of the first driving line 41.

A control terminal of the second switch 44 is connected to the second driving line 42 and is configured to allow communication between the second type data line 32 and a corresponding port data line and communication between a remaining half of the third type data lines 33 and a corresponding port data line under the control of the second driving line 42.

Each port data line is connected to the output terminal of the IC chip.

The first driving line 41 and the second driving line 42 included in the demultiplexer circuit 4 are respectively connected to different driving ports of the output terminal of the IC chip, and the first driving line 41 and the second driving line 42 are in opposite sequences. The first driving line 41 is connected to the first switch 43 and is configured to control the first switch 43 to be turned on or turned off. The first switch 43 and the first type data line 31 correspond to one third type data line 33 in each first circuit group. The second driving line 42 is connected to the second switch 44 and is configured to control the second switch 44 to be turned on or turned off. The second switch 44 and the second type data line 32 correspond to another one third type data line 33 in each first circuit group.

The first switch 43 and the second switch 44 are TFT switches. A control electrode of the first switch 43 is connected to the first driving line 41. A control electrode of the second switch 44 is connected to the second driving line 42. Under the control of the first driving line 41, the first switches 43 are closed. In this case, the first type data line 31 is in communication with a corresponding port data line, and a half of the third type data lines 33 are in communication with a corresponding port data line. Data signals output by the IC chip may be acquired by the first type data line 31 and the half of the third type data lines 33. Under the control of the second driving line 42, the second switches 44 are closed. In this case, the second type data line 32 is in communication with a corresponding port data line. A remaining half of the third type data lines 33 are in communication with a corresponding port data line. Data signals output by the IC chip may be acquired by the second type data line 32 and the remaining half of the third type data lines 33.

The number of the port data lines is the same as the number of columns of pixel circuits 1. Two first type data lines 31 may be connected to the corresponding data ports of the output terminal of the IC chip by the same port data line. Two second type data lines 32 may be connected to the corresponding data ports of the output terminal of the IC chip by the same port data line. Two non-adjacent third type data lines 33 may be connected to the corresponding data ports of the output terminal of the IC chip by the same port data line. For the pixel array shown in FIG. 2, when the data lines D1, D1-1, D2, D2-1, D3, D3-1, D4, and D4-1 are arranged in sequence in the second direction, the data line D3-1 and the data line D1 may be connected to the output terminal of the IC chip by a port data line data1; the data line D1-1 and the data line D3 may be connected to the output terminal of the IC chip by a port data line data3; the data line D4-1 and the data line D2 may be connected to the output terminal of the IC chip by a port data line data2; and the data line D2-1 and the data line D4 may be connected to the output terminal of the IC chip by a port data line data4.

It should be noted that, for two first circuit groups, the connection of the third type data line 33 to the first switch 43 may be the same as or different from the connection of the third type data line 33 to the second switch 44. Different cases are shown in FIG. 2. When the connections are the same, the third type data lines 33 on the left in the two first circuit groups are both connected to the first switch 43 or the second switch 44; when the connections are different, the third type data lines 33 on the left of the second column of pixel circuits 1 shown in FIG. 2 may be connected to the second switch 44, and the third type data lines 33 on the left of the fourth column of pixel circuits 1 may be connected to the first switch 43; or another case may be used. The cases are not listed one by one herein.

Optionally, in an embodiment of the present application, as shown in FIG. 2 and FIG. 4, when the first driving line 41 controls the first switch 43 to be turned on, within a working pulse corresponding to each gate line 2, the pixel circuits 1 connected to the first type data line 31 are in a working state, and the pixel circuits 1 connected to the third type data lines 33 corresponding to the first switch 43 are in a working state.

When the second driving line 42 controls the second switch 44 to be turned on, within a working pulse corresponding to each gate line 2, the pixel circuits 1 connected to the second type data line 32 are in a working state, and the pixel circuits 1 connected to the third type data lines 33 corresponding to the second switch 44 are in a working state.

Referring to the sequence diagram in FIG. 4, for the pixel array in FIG. 2, a case in which the gate lines 2 and the data lines 3 cooperate to control the pixel circuits 1 is described below. The first switch 43 is connected to the second switch 44 under the control of a low potential.

In the first half pulse corresponding to the first-row gate line 2 (the first gate line), at a low level, the first driving line 41 can control the first switch 43 to be turned on. In this case, the pixel circuit 1 corresponding to the sub-pixel R1 (the position of the first row and the first column) and the pixel circuit 1 corresponding to the sub-pixel G5 (the position of the first row and the fourth column) work. In the second half pulse corresponding to the first-row gate line 2, at a low level, the second driving line 42 can control the second switch 44 to be turned on. In this case, the pixel circuit 1 corresponding to the sub-pixel G1 (the position of the first row and the second column) and the pixel circuit 1 corresponding to the sub-pixel B3 (the position of the first row and the third column) work.

In the first half pulse corresponding to the second-row gate line 2 (the second gate line), at a low level, the second driving line 42 can control the second switch 44 to be turned on. In this case, the pixel circuit 1 corresponding to the sub-pixel B1 (the position of the second row and the first column) and the pixel circuit 1 corresponding to the sub-pixel G6 (the position of the second row and the fourth column) work. In the second half pulse corresponding to the second-row gate line 2, at a low level, the first driving line 41 can control the first switch 43 to be turned on. In this case, the pixel circuit 1 corresponding to the sub-pixel G2 (the position of the second row and the second column) and the pixel circuit 1 corresponding to the sub-pixel R3 (the position of the second row and the third column) work.

In the first half pulse corresponding to the third-row gate line 2 (the third gate line), at a low level, the first driving line 41 can control the first switch 43 to be turned on. In this case, the pixel circuit 1 corresponding to the sub-pixel R2 (the position of the third row and the first column) and the pixel circuit 1 corresponding to the sub-pixel G7 (the position of the third row and the fourth column) work. In the second half pulse corresponding to the third-row gate line 2, at a low level, the second driving line 42 can control the second switch 44 to be turned on. In this case, the pixel circuit 1 corresponding to the sub-pixel G3 (the position of the third row and the second column) and the pixel circuit 1 corresponding to the sub-pixel B4 (the position of the third row and the third column) work.

In the first half pulse corresponding to the fourth-row gate line 2 (the fourth gate line), at a low level, the second driving line 42 can control the second switch 44 to be turned on. In this case, the pixel circuit 1 corresponding to the sub-pixel B2 (the position of the fourth row and the first column) and the pixel circuit 1 corresponding to the sub-pixel G8 (the position of the fourth row and the fourth column) work. In the second half pulse corresponding to the fourth-row gate line 2, at a low level, the first driving line 41 can control the first switch 43 to be turned on. In this case, the pixel circuit 1 corresponding to the sub-pixel G4 (the position of the fourth row and the second column) and the pixel circuit 1 corresponding to the sub-pixel R4 (the position of the fourth row and the third column) work.

In the foregoing process, the corresponding organic light-emitting diode can be controlled to emit light through the working of the pixel circuits 1.

With the adoption of high screen refresh rates (such as 90 Hz or 120 Hz), the charging time of a data line keeps decreasing and the risk of miswriting a data signal caused by a gate line delay keeps increasing, and a probability of a color deviation of pure color display and block pure color may be doubled compared with 60 Hz. In the present application, the sub-pixels of the same color are driven in the same column to avoid the foregoing problem of a color deviation. In addition, for a color deviation of a grayscale screen, more adjustment methods are provided.

The embodiments of the present application further provide a display panel, including the foregoing pixel driving circuit.

Figure 5:
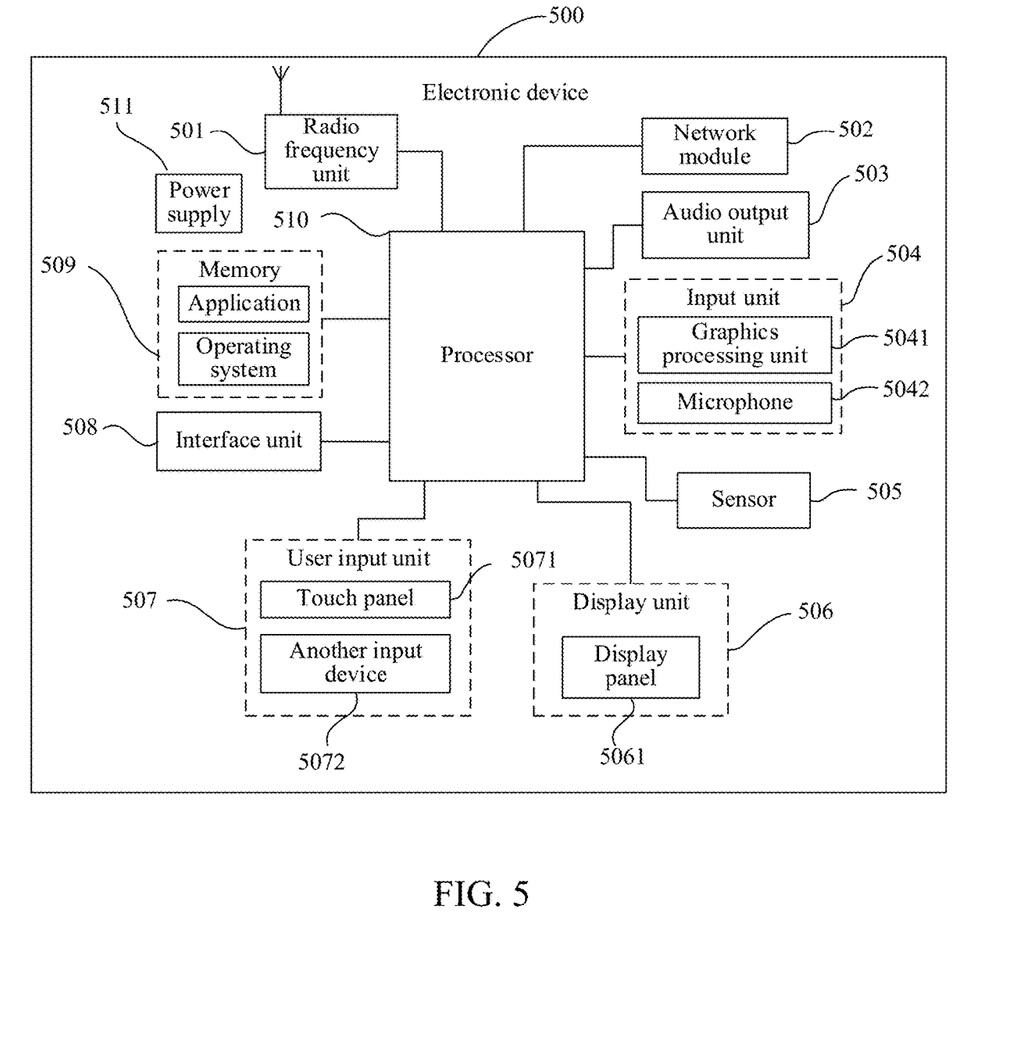
FIG. 5 is a schematic diagram of a hardware structure of an electronic device according to an embodiment of the present application.

FIG. 5 is a schematic structural diagram of hardware of an electronic device implementing the embodiments of the present application. The electronic device 500 includes, but is not limited to, components such as a radio frequency unit 501, a network module 502, an audio output unit 503, an input unit 504, a sensor 505, a display unit 506, a user input unit 507, an interface unit 508, a memory 509, a processor 510, and a power supply 511.

A person skilled in the art may understand that the structure of the electronic device shown in FIG. 5 constitutes no limitation on the electronic device, and the electronic device may include more or fewer components than those shown in the figure, or some components may be combined, or a different component deployment may be used. In the embodiments of the present application, the electronic device includes, but is not limited to, a mobile phone, a tablet computer, a notebook computer, a handheld computer, an in-vehicle terminal, a wearable device, a pedometer, and the like.

It should be understood that, in the embodiments of the present application, the radio frequency unit 501 may be configured to send and receive a signal during an information receiving and sending process or a call process. Specifically, the radio frequency unit receives downlink data from a base station, then delivers the downlink data to the processor 510 for processing, and sends related uplink data to the base station. Generally, the radio frequency unit 501 includes, but is not limited to, an antenna, at least one amplifier, a transceiver, a coupler, a low noise amplifier, a duplexer, and the like. In addition, the radio frequency unit 501 may further communicate with another device through a wireless communication system and network.

The electronic device provides wireless broadband Internet access for a user by using the network module 502, such as helping the user to send and receive emails, browse web pages, and access streaming media.

The audio output unit 503 may convert audio data received by the radio frequency unit 501 or the network module 502 or stored in the memory 509 into an audio signal and output the audio signal as sound. In addition, the audio output unit 503 may further provide an audio output related to a particular function executed by the electronic device 500 (for example, a call signal receiving sound or a message receiving sound). The audio output unit 503 includes a speaker, a buzzer, a receiver, and the like.

The input unit 504 is configured to receive an audio or video signal. The input unit 504 may include a graphics processing unit (Graphics Processing Unit, GPU) 5041 and a microphone 5042. The graphics processing unit 5041 performs processing on image data of a static picture or a video obtained by an image acquisition device (for example, a camera) in a video acquisition mode or an image acquisition mode. The processed image frame may be displayed on the display unit 506. An image frame that has been processed by the graphics processing unit 5041 may be stored in the memory 509 (or another storage medium) or sent by using the radio frequency unit 501 or the network module 502. The microphone 5042 can receive sounds and can process such sounds as audio data. The processed audio data may be converted, in a phone call mode, into a format output that can be sent by the radio frequency unit 501 to a mobile communication base station.

The electronic device 500 may further include at least one sensor 505, such as an optical sensor, a motion sensor, and other sensors. Specifically, the optical sensor includes an ambient light sensor and a proximity sensor. The ambient light sensor may adjust luminance of a display panel 5061 according to brightness of the ambient light. The proximity sensor may switch off the display panel 5061 and/or backlight when the electronic device 500 is moved to ears. As one type of motion sensor, an accelerometer sensor may detect magnitudes of accelerations in various directions (generally, on three axes), may detect a magnitude and a direction of the gravity when static, and may be applied to recognizing the attitude of the electronic device (for example, switching between landscape orientation and portrait orientation, a related game, and magnetometer attitude calibration), a function related to vibration recognition (such as a pedometer and a knock), and the like; the sensor 505 may further include a fingerprint sensor, a pressure sensor, an iris sensor, a molecular sensor, a gyroscope, a barometer, a hygrometer, a thermometer, an infrared sensor, and the like, which is not described in detail herein.

The display unit 506 is configured to display information inputted by the user or information provided for the user. The display unit 506 may include a display panel 5061. The display panel 5061 may be configured in the form of a liquid crystal display (Liquid Crystal Display, LCD), an organic light-emitting diode (Organic Light-Emitting Diode, OLED) and the like.

The display panel 5061 includes a pixel driving circuit, the pixel driving circuit including:
  a pixel array including a plurality of pixel circuits, an RGBG pixel arrangement mode being adopted in the pixel array;
  at least four gate lines, arranged in a first direction of the pixel array, one row of pixel circuits being arranged between every two adjacent gate lines, and each row of pixel circuits corresponding to one gate line;
  at least eight data lines, arranged in a second direction perpendicular to the first direction and intersecting each gate line, each data line being connected to pixel circuits corresponding to sub-pixels of the same color in one column of pixel circuits; and a demultiplexer circuit, connected to the data lines, and configured to control the data lines to be in communication with the integrated circuit (IC) chip.

Optionally, the pixel driving circuit further includes:
  a gate driver on array GOA unit, connected to an output terminal of the IC chip.

The GOA unit includes a first clock signal line, a second clock signal line, a third clock signal line, a fourth clock signal line, a plurality of first GOA circuits connected to the odd-row gate lines, and a plurality of second GOA circuits connected to the even-row gate lines.

The first GOA circuits are connected to the first clock signal line and the second clock signal line, and the second GOA circuits are connected to the third clock signal line and the fourth clock signal line.

The first clock signal line and the second clock signal line are in opposite sequences, and the third clock signal line and the fourth clock signal line are in opposite sequences.

Optionally, in ascending order of row numbers, adjacent first GOA circuits are connected to each other and form a stage transmission of the odd-row gate lines, and adjacent second GOA circuits are connected to each other and form a stage transmission of the even-row gate lines.

Except the first GOA circuit in the last stage, an output terminal of the first GOA circuit in each stage is connected to an input terminal of the first GOA circuit in an adjacent next stage; and except the second GOA circuit in the last stage, an output terminal of the second GOA circuit in each stage is connected to an input terminal of the second GOA circuit in an adjacent next stage.

Optionally, for an odd-row gate line and an even-row gate line that are adjacent, compared with a clock signal of a first GOA circuit corresponding to the odd-row gate line, a clock signal of a second GOA circuit corresponding to the even-row gate line is delayed by half a pulse.

Optionally, the data lines include first type data lines, second type data lines, and third type data lines.

Each column of pixel circuits is a circuit group, the circuit group corresponding to sub-pixels of the same color is a first circuit group, and the circuit group corresponding to sub-pixels of two colors is a second circuit group.

The first type data line is connected to pixel circuits corresponding to sub-pixels of a first color in the second circuit groups, and the second type data line is connected to pixel circuits corresponding to sub-pixels of a second color in the second circuit group.

The third type data lines are connected to the pixel circuits in the first circuit group.

Optionally, a sum of the number of the first type data lines, the number of the second type data lines, and the number of the third type data lines is twice the number of columns corresponding to the pixel circuits.

One first type data line, one second type data line, two third type data lines, one second type data line, one first type data line, and two third type data lines are arranged in sequence in the second direction.

Each third type data line is connected to a half of the pixel circuits in the first circuit group, and at least two pixel circuits connected to one third type data line are arranged adjacently or at intervals.

Optionally, the demultiplexer circuit includes:
  a first driving line, a second driving line having a sequence opposite to that of the first driving line, at least four first switches, and at least four second switches.

The first driving line and the second driving line are connected to the output terminal of the IC chip.

The first type data line and one third type data line in each first circuit group correspond to the first switch, and the second type data line and another one third type data line in each first circuit group correspond to the second switch.

A control terminal of the first switch is connected to the first driving line and is configured to allow communication between the first type data line and a corresponding port data line and communication between a half of the third type data lines and a corresponding port data line under the control of the first driving line.

A control terminal of the second switch is connected to the second driving line and is configured to allow communication between the second type data line and a corresponding port data line and communication between a remaining half of the third type data lines and a corresponding port data line under the control of the second driving line.

Each port data line is connected to the output terminal of the integrated circuit.

Optionally, when the first driving line controls the first switch to be turned on, within a working pulse corresponding to each gate line, the pixel circuits connected to the first type data line are in a working state, and the pixel circuits connected to the third type data lines corresponding to the first switch are in a working state.

When the second driving line controls the second switch to be turned on, within a working pulse corresponding to each gate line, the pixel circuits connected to the second type data line are in a working state, and the pixel circuits connected to the third type data lines corresponding to the second switch are in a working state.

The user input unit 507 may be configured to receive input digit or character information, and generate a keyboard signal input related to the user setting and function control of the electronic device. Specifically, the user input unit 507 includes a touch panel 5071 and another input device 5072. The touch panel 5071, also referred to as a touchscreen, may collect a touch operation of a user on or near the touch panel (such as an operation of a user on the touch panel 5071 or near the touch panel 5071 by using any suitable object or attachment, such as a finger or a stylus). The touch panel 5071 may include two parts: a touch detection apparatus and a touch controller. The touch detection apparatus detects a touch position of the user, detects a signal generated by the touch operation, and transfers the signal to the touch controller. The touch controller receives touch information from the touch detection apparatus, converts the touch information into touch point coordinates, and transmits the touch point coordinates to the processor 510. In addition, the touch controller receives a command transmitted by the processor 510 and executes the command. In addition, the touch panel 5071 may be implemented by using various types, such as a resistive type, a capacitive type, an infrared type, and a surface acoustic wave type. In addition to the touch panel 5071, the user input unit 507 may further include the another input device 5072. Specifically, the another input device 5072 may include, but is not limited to, a physical keyboard, a functional key (such as a volume control key or a switch key), a track ball, a mouse, and a joystick, which are not described in detail herein.

Further, the touch panel 5071 may cover the display panel 5061. After detecting a touch operation on or near the touch panel, the touch panel 5071 transfers the touch operation to the processor 510, to determine a type of a touch event. Then, the processor 510 provides a corresponding visual output on the display panel 5061 according to the type of the touch event. In FIG. 5, the touch panel 5071 and the display panel 5061 are used as two separate parts to implement input and output functions of the electronic device. However, in some embodiments, the touch panel 5071 and the display panel 5061 may be integrated to implement the input and output functions of the electronic device, which is not specifically limited herein.

The interface unit 508 is an interface for connecting an external apparatus and the electronic device 500. For example, the external apparatus may include a wired or wireless headset port, an external power supply (or battery charger) port, a wired or wireless data port, a memory card port, a port for connecting an apparatus with a recognition module, an audio input/output (I/O) port, a video I/O port, a headphone port, and the like. The interface unit 508 may be configured to receive an input (such as data information or electric power) from an external apparatus and transmit the received input to one or more elements in the electronic device 500 or may be configured to transmit data between the electronic device 500 and the external apparatus.

The memory 509 may be configured to store a software program and various data. The memory 509 may mainly include a program storage area and a data storage area. The program storage area may store an operating system, an application program required by at least one function (such as a sound playback function and an image display function), and the like; The data storage area may store data created according to the use of the mobile phone (such as audio data, phone book), and the like. In addition, the memory 509 may include a high-speed random access memory, and may further include a non-volatile memory, such as at least one magnetic disk storage device, a flash memory or another volatile solid-state storage device.

The processor 510 is a control center of the electronic device, and is connected to various parts of the electronic device by using various interfaces and lines. By running or executing the software program and/or module stored in the memory 509, and invoking data stored in the memory 509, the processor performs various functions and data processing of the electronic device, thereby performing overall monitoring on the electronic device. The processor 510 may include one or more processing units. Preferably, the processor 510 may integrate an application processor and a modem processor. The application processor mainly processes an operating system, a user interface, an application program, and the like. The modem processor mainly processes wireless communication. It may be understood that the foregoing modem processor may not be integrated into the processor 510.

The electronic device 500 may further include the power supply 511 (such as a battery) for supplying power to the components. Preferably, the power supply 511 may be logically connected to the processor 510 by a power management system, thereby implementing functions such as charging, discharging, and power consumption management by using the power management system.

In addition, the electronic device 500 includes some unshown functional modules, which are not described in detail herein.

It should be noted that the terms "comprise", "include", or any other variation thereof in this specification is intended to cover a non-exclusive inclusion, making a process, method, article or apparatus including a series of elements include not only those elements, but also other elements not expressly listed, or further elements inherent to such process, method, article or apparatus. Without more limitations, elements defined by the sentence "including one" does not exclude that there are still other same elements in the processes, methods, objects, or apparatuses.

Through the descriptions of the foregoing implementations, a person skilled in the art may clearly understand that the methods in the foregoing embodiments may be implemented through software and a necessary general hardware platform, and certainly, may further be implemented by hardware, but in many cases, the former manner is a better implementation. Based on such understanding, the technical solutions of the present application or a part thereof that makes a contribution to the prior art may be essentially embodied in a form of a software product. The computer software product is stored in a storage medium (such as a ROM/RAM, a disk, and an optical disk), including several instructions to enable one terminal (which may be a mobile phone, a computer, a server, an air conditioner a network device, or the like) to perform the methods in the embodiments of the present application.

The embodiments of the present application are described above with reference to the accompanying drawings. However, the present application is not limited to the foregoing specific implementations. The foregoing specific implementations are illustrative instead of limitative. Enlightened by the present application, a person of ordinary skill in the art may make many forms without departing from the idea of the present application and the scope of protection of the claims. All of the forms fall within the protection of the present application.

What is claimed is:

1. A pixel driving circuit, comprising:
a pixel array comprising a plurality of pixel circuits (1), an RGBG pixel arrangement mode being adopted in the pixel array;
at least four gate lines (2), arranged in a first direction of the pixel array, one row of pixel circuits (1) being arranged between every two adjacent gate lines (2), and each row of pixel circuits (1) corresponding to one gate line (2);
at least eight data lines (3), arranged in a second direction perpendicular to the first direction and intersecting each gate line (2), each data line (3) being connected to pixel circuits (1) corresponding to sub-pixels of the same color in one column of pixel circuits (1); and
a demultiplexer circuit (4), connected to the data lines (3), and configured to control the data lines (3) to be in communication with an integrated circuit (IC) chip;
wherein the data lines (3) comprise first type data lines (31), second type data lines (32), and third type data lines (33);
each column of pixel circuits (1) is a circuit group, the circuit group corresponding to sub-pixels of the same color is a first circuit group, and the circuit group corresponding to sub-pixels of two colors is a second circuit group;
the first type data line (31) is connected to pixel circuits (1) corresponding to sub-pixels of a first color in the second circuit groups, and the second type data line (32) is connected to pixel circuits (1) corresponding to sub-pixels of a second color in the second circuit group; and
the third type data lines (33) are connected to the pixel circuits (1) in the first circuit group; and
wherein the demultiplexer circuit (4) comprises:
a first driving line (41), a second driving line (42) having a sequence opposite to that of the first driving line (41), at least four first switches (43), and at least four second switches (44), wherein
the first driving line (41) and the second driving line (42) are connected to the output terminal of the IC chip;
the first type data line (31) and one third type data line (33) in each first circuit group correspond to the first switch (43), and the second type data line (32) and another one third type data line (33) in each first circuit group correspond to the second switch (44);
a control terminal of the first switch (43) is connected to the first driving line (41) and is configured to allow communication between the first type data line (31) and a corresponding port data line and communication between a half of the third type data lines (33) and a corresponding port data line under the control of the first driving line (41);

a control terminal of the second switch (44) is connected to the second driving line (42) and is configured to allow communication between the second type data line (32) and a corresponding port data line and communication between a remaining half of the third type data lines (33) and a corresponding port data line under the control of the second driving line (42); and
each port data line is connected to the output terminal of the IC chip.

2. The pixel driving circuit according to claim 1, further comprising:
a gate driver on array GOA unit (5), connected to an output terminal of the IC chip, wherein
the GOA unit (5) comprises a first clock signal line (51), a second clock signal line (52), a third clock signal line (53), a fourth clock signal line (54), a plurality of first GOA circuits (55) connected to odd-row gate lines (2), and a plurality of second GOA circuits (56) connected to even-row gate lines (2);
the first GOA circuits (55) are connected to the first clock signal line (51) and the second clock signal line (52), and the second GOA circuits (56) are connected to the third clock signal line (53) and the fourth clock signal line (54); and
the first clock signal line (51) and the second clock signal line (52) are in opposite sequences, and the third clock signal line (53) and the fourth clock signal line (54) are in opposite sequences.

3. The pixel driving circuit according to claim 2, wherein
in ascending order of row numbers, adjacent first GOA circuits (55) are connected to each other and form a stage transmission of the odd-row gate lines (2), and adjacent second GOA circuits (56) are connected to each other and form a stage transmission of the even-row gate lines (2); and
except the first GOA circuit (55) in the last stage, an output terminal of the first GOA circuit (55) in each stage is connected to an input terminal of the first GOA circuit (55) in an adjacent next stage; and except the second GOA circuit (56) in the last stage, an output terminal of the second GOA circuit (56) in each stage is connected to an input terminal of the second GOA circuit (56) in an adjacent next stage.

4. The pixel driving circuit according to claim 3, wherein
for an odd-row gate line (2) and an even-row gate lines (2) that are adjacent, compared with a clock signal of a first GOA circuit (55) corresponding to the odd-row gate line (2), a clock signal of a second GOA circuit (56) corresponding to the even-row gate line (2) is delayed by half a pulse.

5. The pixel driving circuit according to claim 1, wherein
a sum of the number of the first type data lines (31), the number of the second type data lines (32), and the number of the third type data lines (33) is twice the number of columns corresponding to the pixel circuits (1);
one first type data line (31), one second type data line (32), two third type data lines (33), one second type data line (32), one first type data line (31), and two third type data lines (33) are arranged in sequence in the second direction; and
each third type data line (33) is connected to a half of the pixel circuits (1) in the first circuit group, and at least two pixel circuits (1) connected to one third type data line (33) are arranged adjacently or at intervals.

6. The pixel driving circuit according to claim 1, wherein
when the first driving line (41) controls the first switch (43) to be turned on, within a working pulse corresponding to each gate line (2), the pixel circuits (1) connected to the first type data line (31) are in a working state, and the pixel circuits (1) connected to the third type data lines (33) corresponding to the first switch (43) are in a working state; and
when the second driving line (42) controls the second switch (44) to be turned on, within a working pulse corresponding to each gate line (2), the pixel circuits (1) connected to the second type data line (32) are in a working state, and the pixel circuits (1) connected to the third type data lines (33) corresponding to the second switch (44) are in a working state.

7. A display panel, comprising a pixel driving circuit, the pixel driving circuit comprises:
a pixel array comprising a plurality of pixel circuits (1), an RGBG pixel arrangement mode being adopted in the pixel array;
at least four gate lines (2), arranged in a first direction of the pixel array, one row of pixel circuits (1) being arranged between every two adjacent gate lines (2), and each row of pixel circuits (1) corresponding to one gate line (2);
at least eight data lines (3), arranged in a second direction perpendicular to the first direction and intersecting each gate line (2), each data line (3) being connected to pixel circuits (1) corresponding to sub-pixels of the same color in one column of pixel circuits (1); and
a demultiplexer circuit (4), connected to the data lines (3), and configured to control the data lines (3) to be in communication with an integrated circuit (IC) chip;
wherein the data lines (3) comprise first type data lines (31), second type data lines (32), and third type data lines (33);
each column of pixel circuits (1) is a circuit group, the circuit group corresponding to sub-pixels of the same color is a first circuit group, and the circuit group corresponding to sub-pixels of two colors is a second circuit group;
the first type data line (31) is connected to pixel circuits (1) corresponding to sub-pixels of a first color in the second circuit groups, and the second type data line (32) is connected to pixel circuits (1) corresponding to sub-pixels of a second color in the second circuit group; and
the third type data lines (33) are connected to the pixel circuits (1) in the first circuit group; and
wherein the demultiplexer circuit (4) comprises:
a first driving line (41), a second driving line (42) having a sequence opposite to that of the first driving line (41), at least four first switches (43), and at least four second switches (44), wherein
the first driving line (41) and the second driving line (42) are connected to the output terminal of the IC chip;
the first type data line (31) and one third type data line (33) in each first circuit group correspond to the first switch (43), and the second type data line (32) and another one third type data line (33) in each first circuit group correspond to the second switch (44);
a control terminal of the first switch (43) is connected to the first driving line (41) and is configured to allow communication between the first type data line (31) and a corresponding port data line and communication between a half of the third type data lines (33) and a corresponding port data line under the control of the first driving line (41);
a control terminal of the second switch (44) is connected to the second driving line (42) and is configured to allow communication between the second type data line (32) and a corresponding port data line and communication between a remaining half of the third type data lines (33) and a corresponding port data line under the control of the second driving line (42); and
each port data line is connected to the output terminal of the IC chip.

8. The display panel according to claim 7, wherein the pixel driving circuit comprises further comprising:
a gate driver on array GOA unit (5), connected to an output terminal of the IC chip, wherein
the GOA unit (5) comprises a first clock signal line (51), a second clock signal line (52), a third clock signal line (53), a fourth clock signal line (54), a plurality of first GOA circuits (55) connected to odd-row gate lines (2), and a plurality of second GOA circuits (56) connected to even-row gate lines (2);
the first GOA circuits (55) are connected to the first clock signal line (51) and the second clock signal line (52), and the second GOA circuits (56) are connected to the third clock signal line (53) and the fourth clock signal line (54); and
the first clock signal line (51) and the second clock signal line (52) are in opposite sequences, and the third clock signal line (53) and the fourth clock signal line (54) are in opposite sequences.

9. The display panel according to claim 8, wherein
in ascending order of row numbers, adjacent first GOA circuits (55) are connected to each other and form a stage transmission of the odd-row gate lines (2), and adjacent second GOA circuits (56) are connected to each other and form a stage transmission of the even-row gate lines (2); and
except the first GOA circuit (55) in the last stage, an output terminal of the first GOA circuit (55) in each stage is connected to an input terminal of the first GOA circuit (55) in an adjacent next stage; and except the second GOA circuit (56) in the last stage, an output terminal of the second GOA circuit (56) in each stage is connected to an input terminal of the second GOA circuit (56) in an adjacent next stage.

10. The display panel according to claim 9, wherein
for an odd-row gate line (2) and an even-row gate lines (2) that are adjacent, compared with a clock signal of a first GOA circuit (55) corresponding to the odd-row gate line (2), a clock signal of a second GOA circuit (56) corresponding to the even-row gate line (2) is delayed by half a pulse.

11. The display panel according to claim 7, wherein
a sum of the number of the first type data lines (31), the number of the second type data lines (32), and the number of the third type data lines (33) is twice the number of columns corresponding to the pixel circuits (1);
one first type data line (31), one second type data line (32), two third type data lines (33), one second type data line (32), one first type data line (31), and two third type data lines (33) are arranged in sequence in the second direction; and
each third type data line (33) is connected to a half of the pixel circuits (1) in the first circuit group, and at least two pixel circuits (1) connected to one third type data line (33) are arranged adjacently or at intervals.

12. The display panel according to claim 7, wherein
when the first driving line (41) controls the first switch (43) to be turned on, within a working pulse corresponding to each gate line (2), the pixel circuits (1) connected to the first type data line (31) are in a working state, and the pixel circuits (1) connected to the third type data lines (33) corresponding to the first switch (43) are in a working state; and
when the second driving line (42) controls the second switch (44) to be turned on, within a working pulse corresponding to each gate line (2), the pixel circuits (1) connected to the second type data line (32) are in a working state, and the pixel circuits (1) connected to the third type data lines (33) corresponding to the second switch (44) are in a working state.

13. An electronic device, comprising a display panel, the display panel comprises a pixel driving circuit, the pixel driving circuit comprises:
a pixel array comprising a plurality of pixel circuits (1), an RGBG pixel arrangement mode being adopted in the pixel array;
at least four gate lines (2), arranged in a first direction of the pixel array, one row of pixel circuits (1) being arranged between every two adjacent gate lines (2), and each row of pixel circuits (1) corresponding to one gate line (2);
at least eight data lines (3), arranged in a second direction perpendicular to the first direction and intersecting each gate line (2), each data line (3) being connected to pixel circuits (1) corresponding to sub-pixels of the same color in one column of pixel circuits (1); and
a demultiplexer circuit (4), connected to the data lines (3), and configured to control the data lines (3) to be in communication with an integrated circuit (IC) chip;
wherein the data lines (3) comprise first type data lines (31), second type data lines (32), and third type data lines (33);
each column of pixel circuits (1) is a circuit group, the circuit group corresponding to sub-pixels of the same color is a first circuit group, and the circuit group corresponding to sub-pixels of two colors is a second circuit group;
the first type data line (31) is connected to pixel circuits (1) corresponding to sub-pixels of a first color in the second circuit groups, and the second type data line (32) is connected to pixel circuits (1) corresponding to sub-pixels of a second color in the second circuit group; and
the third type data lines (33) are connected to the pixel circuits (1) in the first circuit group; and
wherein the demultiplexer circuit (4) comprises:
a first driving line (41), a second driving line (42) having a sequence opposite to that of the first driving line (41), at least four first switches (43), and at least four second switches (44), wherein
the first driving line (41) and the second driving line (42) are connected to the output terminal of the IC chip;
the first type data line (31) and one third type data line (33) in each first circuit group correspond to the first switch (43), and the second type data line (32) and another one third type data line (33) in each first circuit group correspond to the second switch (44);
a control terminal of the first switch (43) is connected to the first driving line (41) and is configured to allow communication between the first type data line (31) and a corresponding port data line and communication between a half of the third type data lines (33) and a corresponding port data line under the control of the first driving line (41);
a control terminal of the second switch (44) is connected to the second driving line (42) and is configured to allow communication between the second type data line (32) and a corresponding port data line and communication between a remaining half of the third type data lines (33) and a corresponding port data line under the control of the second driving line (42); and
each port data line is connected to the output terminal of the IC chip.

14. The electronic device according to claim 13, wherein the pixel driving circuit comprises further comprising:
a gate driver on array GOA unit (5), connected to an output terminal of the IC chip, wherein
the GOA unit (5) comprises a first clock signal line (51), a second clock signal line (52), a third clock signal line (53), a fourth clock signal line (54), a plurality of first GOA circuits (55) connected to odd-row gate lines (2), and a plurality of second GOA circuits (56) connected to even-row gate lines (2);
the first GOA circuits (55) are connected to the first clock signal line (51) and the second clock signal line (52), and the second GOA circuits (56) are connected to the third clock signal line (53) and the fourth clock signal line (54); and
the first clock signal line (51) and the second clock signal line (52) are in opposite sequences, and the third clock signal line (53) and the fourth clock signal line (54) are in opposite sequences.

15. The electronic device according to claim 14, wherein in ascending order of row numbers, adjacent first GOA circuits (55) are connected to each other and form a stage transmission of the odd-row gate lines (2), and adjacent second GOA circuits (56) are connected to each other and form a stage transmission of the even-row gate lines (2); and
except the first GOA circuit (55) in the last stage, an output terminal of the first GOA circuit (55) in each stage is connected to an input terminal of the first GOA circuit (55) in an adjacent next stage; and except the second GOA circuit (56) in the last stage, an output terminal of the second GOA circuit (56) in each stage is connected to an input terminal of the second GOA circuit (56) in an adjacent next stage.

16. The electronic device according to claim 15, wherein for an odd-row gate line (2) and an even-row gate lines (2) that are adjacent, compared with a clock signal of a first GOA circuit (55) corresponding to the odd-row gate line (2), a clock signal of a second GOA circuit (56) corresponding to the even-row gate line (2) is delayed by half a pulse.

* * * * *